United States Patent
Tamarkin (12)

(10) Patent No.: US 6,310,412 B1
(45) Date of Patent: Oct. 30, 2001

(54) THREE-PHASE AC DISTRIBUTION SYSTEM AND METHOD FOR PRINTED CIRCUIT BOARDS

(75) Inventor: Vladimir K. Tamarkin, Huntingdon Valley, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/285,816

(22) Filed: Apr. 2, 1999

(51) Int. Cl.[7] ........................................ H01B 7/30
(52) U.S. Cl. ............................. 307/147; 174/261
(58) Field of Search ..................... 174/250, 261, 174/36, 117 FF; 361/777; 307/147, 42, 326, 38

(56) References Cited

U.S. PATENT DOCUMENTS

| | | | |
|---|---|---|---|
| 3,543,198 | * | 11/1970 | Stopper . |
| 4,045,750 | * | 8/1977 | Marshall . |
| 4,130,723 | * | 12/1978 | Wakeling . |
| 4,707,671 | * | 11/1987 | Suzuki et al. . |
| 4,798,918 | * | 1/1989 | Kabadi et al. . |
| 5,497,037 | * | 3/1996 | Lee et al. .................... 307/42 |
| 5,844,783 | * | 12/1998 | Kojima . |

\* cited by examiner

*Primary Examiner*—Kamand Cuneo
(74) *Attorney, Agent, or Firm*—Woodcock Washburn Kurtz Mackiewicz & Norris LLP; Mark T. Starr; Lise A. Rode

(57) ABSTRACT

A system and method for distributing three-phase alternating current on a printed circuit board are provided. The system comprises a connector having a plurality of pins and a corresponding trace on the printed circuit board for each of the pins. The spacing between adjacent traces satisfies a first minimum spacing requirement, and the spacing between alternating traces satisfies a second minimum spacing requirement larger than the first minimum spacing requirement. When the system is employed in an environment that imposes the second minimum spacing requirement, the traces are defined such that the different phases of the alternating current are carried on alternating traces with the traces in between defined as neutrals. When the system is employed in an environment that imposes the first minimum spacing requirement, the traces can be defined such that the different phases of the alternating current are carried on adjacent traces. Distribution density is optimized while enabling the same system to be used in environments that impose either of the two minimum spacing requirements.

4 Claims, 3 Drawing Sheets

THREE-PHASE AC DISTRIBUTION SYSTEM AND METHOD FOR PRINTED CIRCUIT BOARDS

BACKGROUND

1. Field of the Invention

The present invention is directed generally to printed circuit boards and related connectors, and more particularly, to a system and method for providing distribution of three-phase alternating current ("AC") on a printed circuit board.

2. Description of the Prior Art

Companies that develop electronic equipment for three-phase AC operation face the challenge of designing a power distribution system that meets the requirements of organizations, such as Underwriters Laboratories Inc. ("UL") and the Canadian Standards Association ("CSA"). Also, in a global economy, equipment often needs to be compatible with both the 120V three-phase AC environment found in the United States and Japan and the 220V three-phase AC environment found in other countries, particularly in Europe. The design task is even more complicated when three-phase alternating current must be distributed on a printed circuit board where space on the board is often limited.

FIG. 1 shows a prior art system 10 for distributing three-phase alternating current on a printed circuit board 12. The system 10 comprises a connector 14 having a plurality of pins (e.g., pin 16) and a corresponding plurality of traces 20–28, each of which is electrically connected to one or more of the respective pins via a solder pad (e.g., solder pad 18). As is common in the prior art, each of the pins connected to traces 22, 24, and 26 are defined to carry one of the three phases of the alternating current. Three of the other pins are collectively connected to a single trace 20 defined as a neutral. Trace 28 and its corresponding pin are undefined in this example. As is common with this type of system, the pins of the connector 14 are arranged substantially in a line and are spaced equidistantly from each other, i.e., the spacing, S, between the different solder pads (and associated traces) on the printed circuit board 12 is uniform.

With respect to the three-phase AC distribution system illustrated in FIG. 1, regulatory agencies and other organizations have set certain minimum safety requirements for the spacing, S, between adjacent traces that carry the different phases for a three-phase AC distribution. Unfortunately, the minimum spacing requirements are different in the United States and Japan than the requirements in Europe, mainly as a result of the different operating voltages in those regions—120 V in the United States and Japan, 220V in Europe. Specifically, for 120V three-phase AC distribution, two traces that carry respective phases of the AC must be spaced apart at least 2.5 millimeters. For 220V three-phase AC distribution, the spacing must be a minimum of 3.2–4.0 millimeters. A problem that arises as a result of these differences is how to design a three-phase AC distribution system for a printed circuit board that can operate in both 120V and 220V environments.

One solution to the minimum spacing problem is simply to use a larger connector designed with larger clearances for boards that will be operated in the larger voltage environment. Another solution for larger voltages is to use a separate connector for each of the different phases. Unfortunately, these solutions are disadvantageous because they require more room on the printed circuit board and a more expensive connector solution. A more preferable solution would allow a single three-phase AC distribution system to be used in both environments while optimizing distribution density and reducing cost. The present invention satisfies this need.

SUMMARY OF THE INVENTION

The present invention is directed to a system and method for distributing three-phase alternating current (AC) on a printed circuit board. The system comprises a connector having a plurality of pins and a corresponding trace on the printed circuit board for each of the pins. The spacing between adjacent traces satisfies a first minimum spacing requirement, and the spacing between alternating traces (i.e., "every other" trace) satisfies a second minimum spacing requirement larger than the first minimum spacing requirement. When the three-phase AC distribution system of the present invention is employed in an environment that imposes the second, larger minimum spacing requirement, the traces are defined such that the different phases of the alternating current are carried on alternating traces (i.e., "every other" trace), with the traces in between defined as neutrals. When the three-phase AC distribution system is employed in an environment that imposes the first, lesser minimum spacing requirement, the traces can be defined such that the different phases of the alternating current are carried on adjacent traces. This optimizes distribution density while enabling the same system to be used in environments that impose either of two different minimum spacing requirements between phase carrying traces. Preferably, at least one of the spacings is equal to the respective minimum spacing requirement that it satisfies, thus obtaining the most optimum allowable distribution density.

A method for distributing three-phase alternating current on a printed circuit board in accordance with the present invention comprises:

providing a connector having a plurality of pins;

providing a corresponding trace on the printed circuit board for each of the pins, the spacing between adjacent traces satisfying a first minimum spacing requirement and the spacing between alternating traces satisfying a second minimum spacing requirement larger than the first minimum spacing requirement;

defining the traces such that the different phases of the alternating current are carried on alternating traces with the traces in between defined as neutrals, when the system is employed in an environment that imposes the second minimum spacing requirement; and defining the traces such that the different phases of the alternating current are carried on adjacent traces, when the system is employed in an environment that imposes the first minimum spacing requirement.

Additional features and advantages of the present invention will become evident hereinafter.

BRIEF DESCRIPTION OF THE DRAWINGS

The foregoing summary, as well as the following detailed description of the preferred embodiment, is better understood when read in conjunction with the appended drawings. For the purpose of illustrating the invention, there is shown in the drawings an embodiment that is presently preferred, it being understood, however, that the invention is not limited to the specific methods and instrumentalities disclosed. In the drawings.

DETAILED DESCRIPTION OF THE PREFERRED EMBODIMENTS

Figure 1:
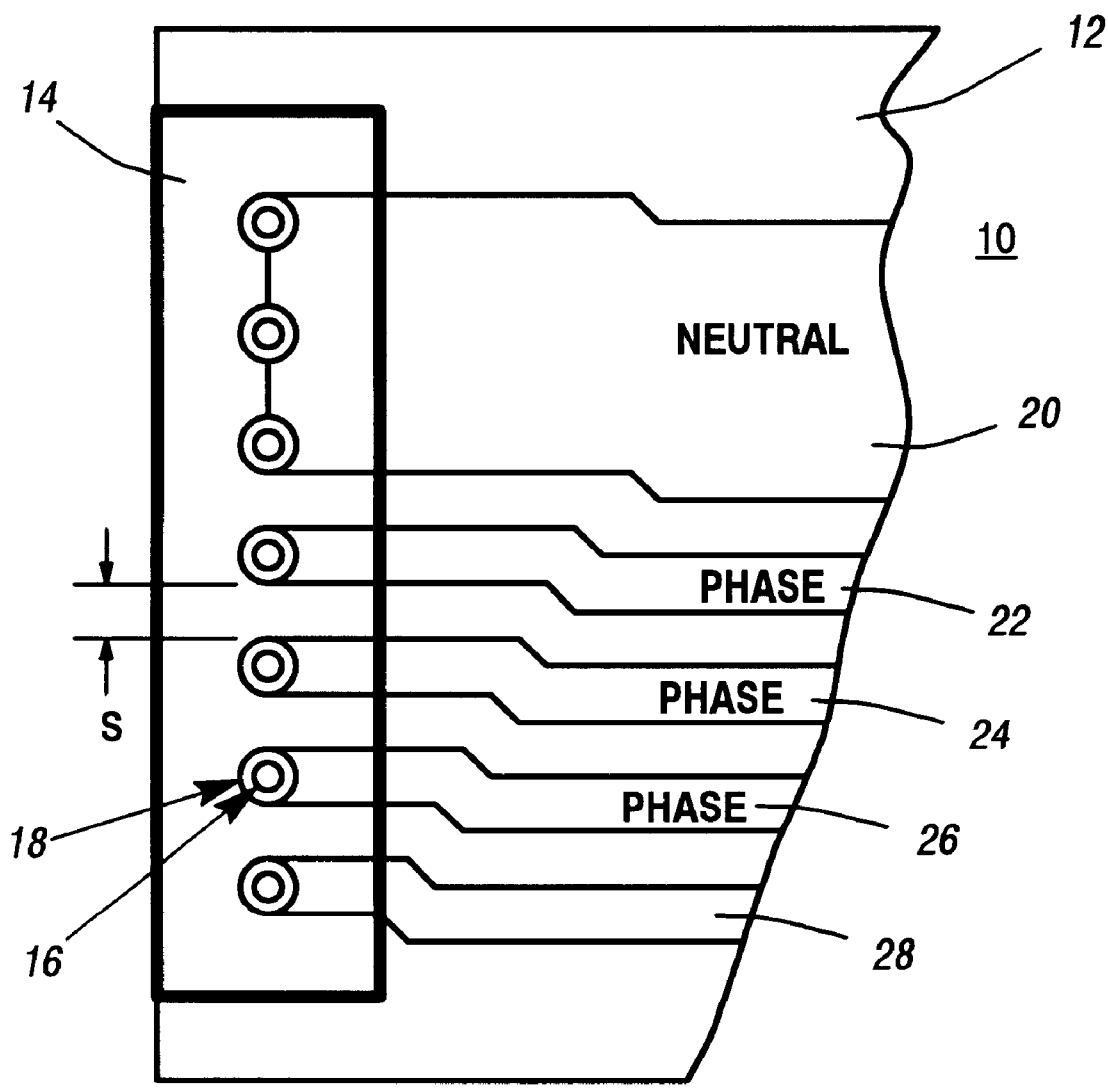
FIG. 1 shows a prior art three-phase AC distribution system for printed circuit boards.
Figure 2:
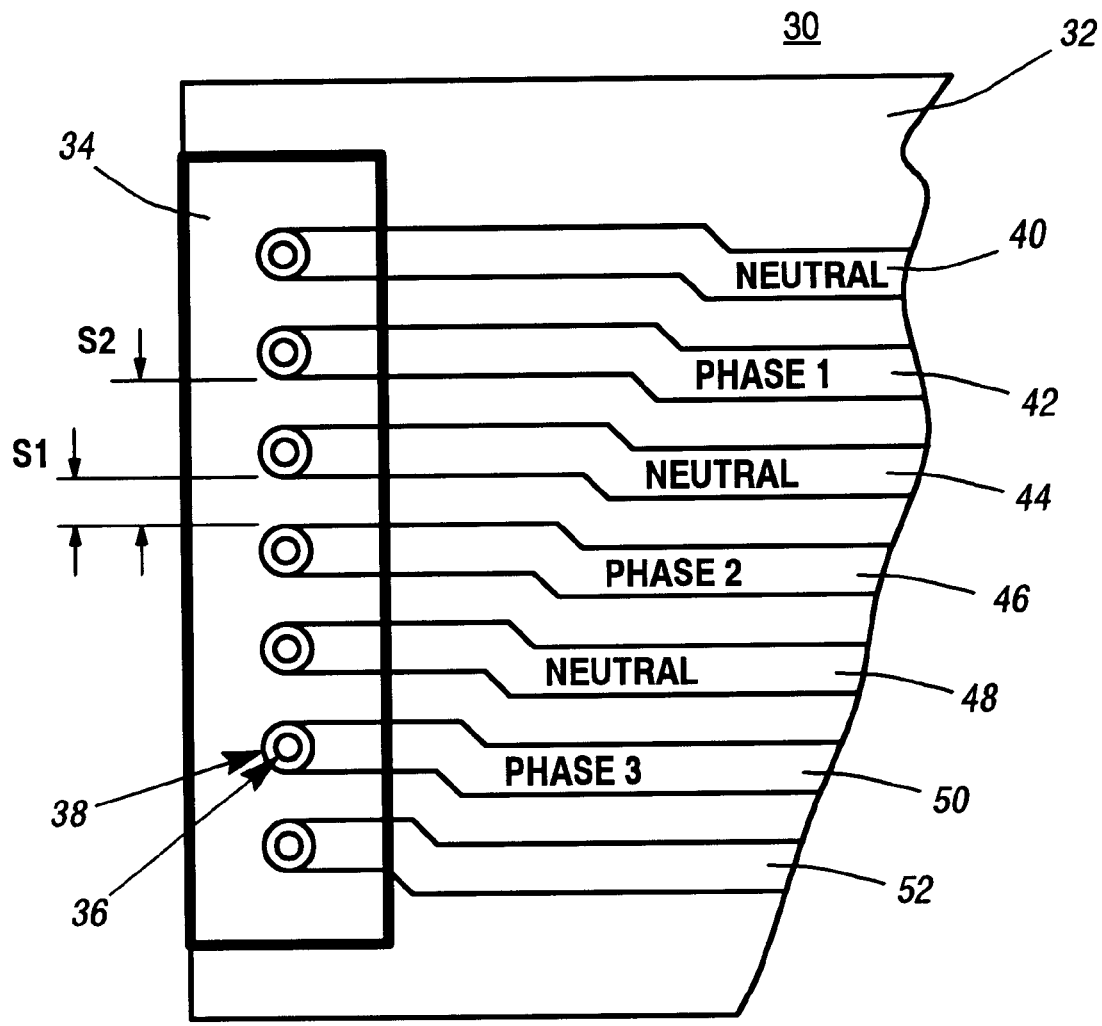
FIG. 2 shows one implementation of a three-phase AC distribution system for printed circuit boards in accordance with the present invention.

Referring to the drawings, wherein like numerals represent like elements throughout, FIG. 2 shows a three-phase AC distribution system 30 for a printed circuit board 32 in accordance with a preferred embodiment of the present invention. The system 30 comprises a connector 34 having a plurality of pins (e.g., pin 36) and a corresponding trace on the printed circuit board for each of the pins (e.g., traces 40–52).

In the present embodiment, the pins (e.g., pin 36) are uniformly spaced and are arranged substantially in a line. However, the present invention is by no means limited to this kind of pin configuration. For example, in other embodiments, there can be more than one row pins. Also, other pin configurations can be employed. For example, the pins could be staggered about a center line, or alternatively, could be arranged in another geometric configuration such as a circle. The present invention encompasses all such possibilities.

The pins may be made of gold, copper, tin, or any other suitable electrically conductive material capable of carrying the required current. Preferably, the pins are connected to solder pads (e.g., pad 38) formed as part of each of the respective traces 40–52. The pins of the connector 34 can be connected to the respective solder pads via a surface mount technique or via through-holes (not shown) provided in the circuit board 32. The traces 40–52 are preferably made of copper, but can be made of any other electrically conductive material suitable for carrying the required current, if desired. Additionally, while the traces 40–52 comprise individual conductors in this example, the traces 40–52 could each be formed from a group of smaller, closely spaced traces that work together to carry the particular phase or neutral shown in FIG. 2.

In accordance with the present invention, the spacing S1 between adjacent traces (e.g., between traces 40 and 42, between traces 42 and 44, etc.) satisfies a first minimum spacing requirement, and the spacing S2 between alternating traces (i.e., "every other" trace)(e.g., between traces 40 and 44, between traces 44 and 48, etc.) satisfies a second minimum spacing requirement larger than the first minimum spacing requirement. As further illustrated in FIG. 2, when the three-phase AC distribution system 30 is employed in an environment that imposes the second, larger minimum spacing requirement, the traces are defined such that the different phases of the alternating current are carried on alternating traces (i.e., "every other" trace), with the traces in between defined as neutrals. Specifically, in this example, the three-phases of the AC are carried, respectively, on alternating traces 42, 46, and 50, while the traces in between (e.g., traces 44 and 48) are defined as neutrals. Because the spacing, S2, between alternating traces satisfies the second minimum spacing requirement, the requirement is met with this arrangement.

Figure 3:
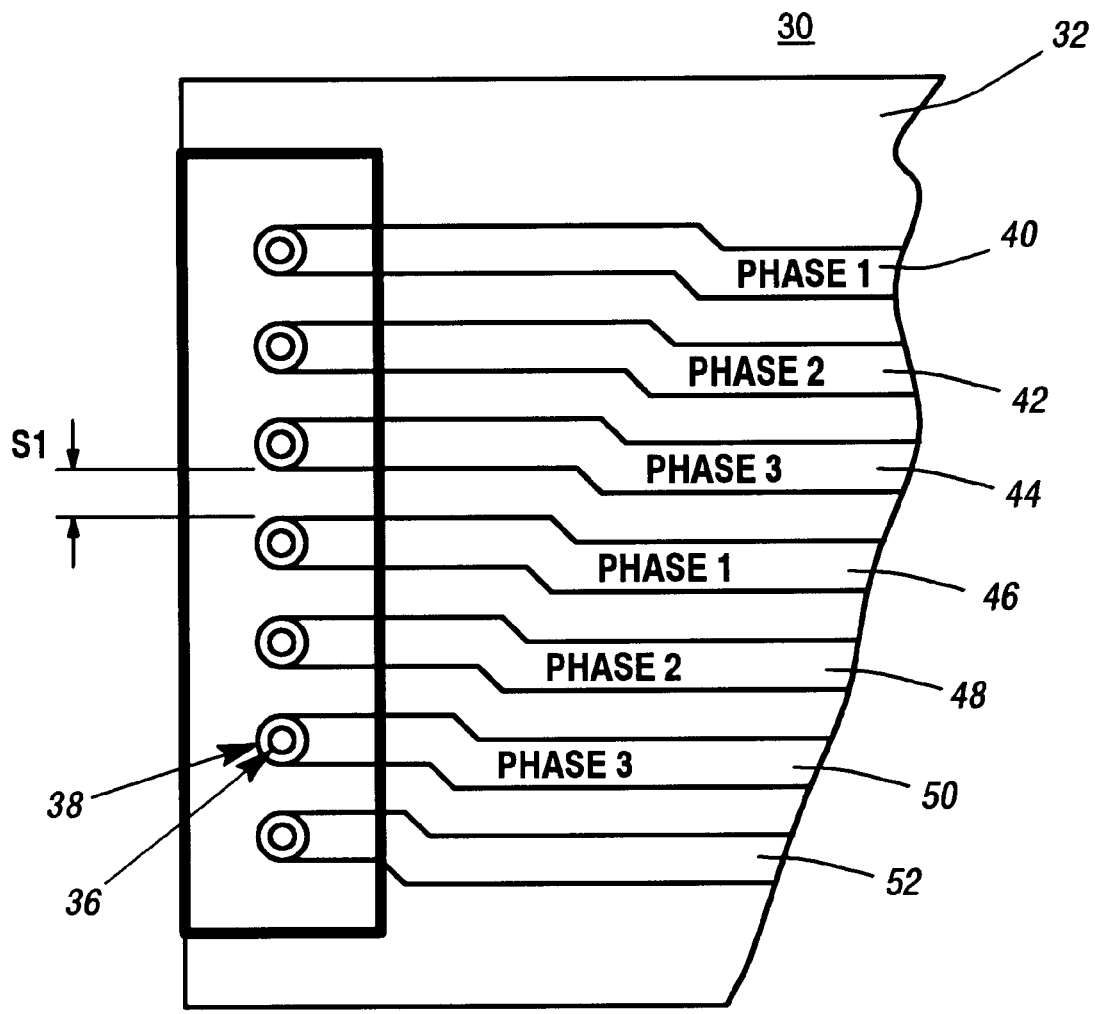
FIG. 3 shows another implementation of the three-phase AC distribution system of the present invention.

Because the spacing S1 between adjacent traces satisfies the first minimum spacing requirement, the same three-phase AC distribution system 30 of the present invention can also be used in an environment that imposes the lesser, first minimum spacing requirement. Such a use is illustrated in FIG. 3. Specifically, when the three-phase AC distribution system 30 is employed in an environment that imposes the first, lesser minimum spacing requirement, the traces can be defined such that the different phases of the alternating current are carried on adjacent traces. As shown in this example, the three-phases of the AC are carried on adjacent traces 40, 42, and 44. The spacing S1 between adjacent traces satisfies the first minimum spacing requirement. Moreover, because of the smaller spacing requirement, a higher density can be achieved by, for example, duplicating the distribution on traces 46, 48, and 50, respectively. Trace 52 can be defined as the neutral, in this example.

Preferably, at least one of the spacings, S1 and S2, is equal to its respective minimum spacing requirements, thus obtaining the most optimum allowable distribution density.

A method for distributing three-phase alternating current on a printed circuit board in accordance with the present invention comprises:

providing a connector having a plurality of pins, such as, for example, the connector 34 of FIG. 2;

providing a corresponding trace on the printed circuit board for each of the pins (e.g., traces 40–52), the spacing between adjacent traces satisfying a first minimum spacing requirement and the spacing between alternating traces satisfying a second minimum spacing requirement larger than the first minimum spacing requirement;

defining the traces such that the different phases of the alternating current are carried on alternating traces with the traces in between defined as neutrals (e.g., FIG. 2), when the system is employed in an environment that imposes the second minimum spacing requirement; and defining the traces such that the different phases of the alternating current are carried on adjacent traces (e.g., FIG. 3), when the system is employed in an environment that imposes the first minimum spacing requirement.

As one example of the utility of the present invention, the system and method described above can be used to provide three-phase alternating current distribution in both 120V environments (e.g., United States/Japan) and 220V environments (e.g., Europe). As mentioned above, for 120V three-phase AC environments, the minimum spacing requirement between adjacent phase-carrying traces is 2.5 millimeters. For 220V three-phase AC environments two phase-carrying traces must be separated by approximately 3.2–4.0 millimeters. One embodiment of a connector system according to the present invention for use in these environments has a spacing S1 between adjacent traces of about, but not less than, 2.5 mm, and an effective spacing S2 between alternating traces (i.e., excluding the width of the traces in between) of about, but not less than, 5.0 mm. In this embodiment, the spacing S1 satisfies the 2.5 mm minimum spacing requirement between phases of a three-phase 120V AC distribution (first minimum spacing requirement), and the spacing S2 satisfies the 3.2–4.0 mm minimum spacing requirement between phases of a three-phase 220V AC distribution. When the connector system is used in a 220V environment, such as that found in Europe, the traces are defined as shown in FIG. 2, where the different phases of the alternating current are carried on alternating traces with the traces in between defined as neutrals. When the connector system is used in a 120V environment, such as that found in the United States and Japan, the traces can be defined to carry phases in the manner illustrated in FIG. 3, where the phases are carried on adjacent traces. The system and method of the present invention thus assures compliance with the minimum spacing requirements for both European (220V) and US/Japan (120V) three-phase AC environments using a single distribution system while at the same time achieving the highest allowable distribution density. The ability to use the same three-phase AC distribution system for both European and US/Japan environments provides significant advantages in terms of cost and manufacturability. It is understood, however, the present invention is by no means limited to use only in 120V and 220V environments, but rather can be employed in any two environments that require different minimum spacing requirements. The 120V and 220V environments discussed herein are merely examples.

As the foregoing illustrates, the present invention is directed to a three-phase AC distribution system for printed circuit boards. The present invention optimizes distribution density while enabling the system to be used in environments that impose either of two different minimum spacing requirements between phase carrying traces. It is understood that changes may be made to the embodiments described above without departing from the broad inventive concepts thereof. Accordingly, the present invention is not limited to the particular embodiments disclosed, but is intended to cover all modifications that are within the spirit and scope of the invention as defined by the appended claims.

What is claimed is:

1. A method for distributing three-phase alternating current, comprising:

providing a printed circuit board having a plurality of traces for carrying alternating current, the printed circuit board being adapted for use in both a first environment and a second environment, the first environment imposing a first minimum spacing requirement and the second environment imposing a second minimum spacing requirement that is independent of and larger than the first minimum spacing requirement, the spacing between adjacent traces on said printed circuit board satisfying said first minimum spacing requirement and the spacing between alternating traces on said printed circuit board satisfying said second minimum spacing requirement;

when the system is employed in an environment that imposes the second minimum spacing requirement, distributing the different phases of the alternating current on alternating traces with the traces in between defined as neutrals; and when the system is employed in an environment that imposes the first minimum spacing requirement, distributing the different phases of the alternating current on adjacent traces.

2. The method recited in claim 1 wherein at least one of the spacing between adjacent traces and the spacing between alternating traces is equal to the respective minimum spacing requirement that it satisfies.

3. The method recited in claim 1, wherein the first minimum spacing requirement is 2.5 millimeters, and the second minimum spacing requirement is in the range of 3.2–4.0 millimeters.

4. The method recited in claim 3, wherein the spacing between adjacent traces is 2.5 millimeters, and the spacing between alternating traces is effectively 5.0 millimeters.

* * * * *